United States Patent
Welstand et al.

(10) Patent No.: US 6,437,669 B1
(45) Date of Patent: Aug. 20, 2002

(54) MICROWAVE TO MILLIMETER WAVE FREQUENCY SUBSTRATE INTERFACE

(75) Inventors: Robert B. Welstand; Timothy L. Leclair, both of San Diego, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 4 days.

(21) Appl. No.: 09/675,639

(22) Filed: Sep. 29, 2000

(51) Int. Cl.⁷ .................................................. H01P 3/08
(52) U.S. Cl. ........................................ 333/246; 333/247
(58) Field of Search ................................ 333/246, 247; 257/778, 728

(56) References Cited

U.S. PATENT DOCUMENTS

| | | | |
|---|---|---|---|
| 5,014,115 A | 5/1991 | Moser | 357/74 |
| 5,162,257 A | * 11/1992 | Yung | 437/183 |
| 5,281,772 A | * 1/1994 | Myers et al. | 174/267 |
| 5,506,875 A | 4/1996 | Nuckolls et al. | 375/375 |
| 5,528,203 A | 6/1996 | Mohwinkel et al. | 333/128 |
| 5,668,512 A | 9/1997 | Mohwinkel et al. | 333/247 |
| 5,707,575 A | 1/1998 | Litt et al. | 264/104 |
| 5,808,691 A | 9/1998 | Malcolm, Jr. et al. | 348/537 |
| 6,016,005 A | 1/2000 | Cellarosi | 257/703 |
| 6,025,647 A | 2/2000 | Shenoy et al. | 257/775 |
| 6,031,425 A | 2/2000 | Hasegawa | 331/1 A |
| 6,051,093 A | 4/2000 | Tsukahara | 156/251 |
| 6,052,152 A | 4/2000 | Malcolm, Jr. et al. | 348/537 |
| 6,052,287 A | 4/2000 | Palmer et al. | 361/767 |

FOREIGN PATENT DOCUMENTS

JP          358148434 A   *  9/1983   ............ H01L/21/60

* cited by examiner

Primary Examiner—Robert Pascal
Assistant Examiner—Joseph Chang
(74) Attorney, Agent, or Firm—Gray Cary Ware & Freidenrich (57) ABSTRACT

An interface have been provided to permit the formation of solder connections between substrates suitable for microwave to millimeter wave frequencies. Specifically, signal traces on the substrate are selectively masked to form solder dams. The high temperature, thick-film solder dams define the bonding area and control the flow of solder. Since the solder dam forms a finite-extent structure, the solder mask minimally overlies the signal trace, and signal propagation through the trace is not degraded.

32 Claims, 6 Drawing Sheets

MICROWAVE TO MILLIMETER WAVE FREQUENCY SUBSTRATE INTERFACE

BACKGROUND OF THE INVENTION

1. Field of the Invention

This invention relates generally to microwave and millimeter wave substrate technology and, more particularly, to a method for forming microwave and millimeter wave frequency solder connections to a substrate.

2. Description of the Related Art

Stripline, microstrip, and coplanar waveguide technologies are some of the well-known ways to propagate microwave frequencies across, and through printed circuit boards (PCBs), integrated circuit (IC) packages, and microwave integrated circuit (MIC) substrate. As used herein, microwave frequencies refer to frequencies generally in the range between 300 megahertz (MHz) and 30 gigahertz (GHz), while millimeter wave frequencies are greater than 30 GHZ. Also, the term substrate, as used herein, is the signal distribution body of an IC package. Conventionally, alumina ceramics ($Al_2O_3$), or glasses with ceramic loading, are used as substrates when the signal speeds are especially high, or the signal loss critical. It is also known to communicate between alumina substrate or PCB layers using vias and interlevel signal traces. However, one serious problem in the use of microwave to millimeter wave frequencies on a substrate is the interfacing of these signals to and from the substrate.

It is known to use leaded packages to form low microwave frequency connections from an IC package to a PCB. The leads typically extend from the side of the package, but can be surface mounted to the PCB when the leads are shaped by bending to be coplanar with the bottom surface of the package. However, this form of interface provides poor millimeter wave performance due to lead finger inductance and electromagnetic radiation of the signal in the curved leads. A straight lead version has improved millimeter wave performance, but cannot be surface mounted.

It is known to efficiently propagate microwave and millimeter wave frequencies through coaxial cables or waveguides. However, the connection of these transmission mediums to a substrate is cumbersome and expensive in high-volume manufacturing.

IC die connections can be made to the substrate using wire bonds. However, microwave to millimeter wave frequency performance of wire bonds is limited by the wire bond inductance. When an IC die is to be bonded, the chip bottom surface is typically attached to the substrate top surface, and relatively long wire bonds must be formed laterally across the substrate and die surfaces, between the substrate bonding pads and the pads on the die top surface.

An IC flip-chip die is a well-known semiconductor component that is conducive to low-cost circuit fabrication. The flip-chip die is formed with the bonding pads on the top surface. Either high temperature (PbSn or AuSn) or low temperature (eutectic SnPb) solder balls can be attached to these pads. When the die is to be attached to a substrate, the die is flipped so that the top surface overlies the substrate top surface, and its bonding pads are aligned over corresponding bonding pads on the substrate top surface. Heat is applied and the solder balls melt, connecting the pads of the flip-chip die to the pads of the substrate.

Dielectric film solder masks are typically used to help define solder connections to the substrate or PCB. The solder mask can be formed to selectively expose bonding areas where connections are made, or solder is applied. The remaining areas of solder mask act to contain the solder flow and prevent the accidental shorting of signal traces on the substrate or PCB with applied solder.

The solder mask openings on both sides of the solder connection control the solder reflow, and the surface tension of the molten solder causes the two bonding surfaces to stand a predetermined distance from each other.

To some extent, the problem of surface-mountable connections has been addressed by using flip-chip die attachment and grid ball array (BGA) connections to the PCB in the fabrication of cellular telephones. However, even cellular telephones rarely use signals higher than 2 gigahertz. Another huge commercial environment using flip-chip and BGA technology, the personal computer, barely uses low microwave frequency signals, and conventional connection techniques can be used to interface even the highest speed microprocessor IC to a package, and the package to a PCB. However, the advent of Internet and fiber optically related communications have brought forth the need for commercial microwave to millimeter wave frequency IC package and PCB connections.

At low microwave frequencies the dielectric film solder masks, discussed above, have negligible effect on signal propagation when they cover the signal traces on a PCB or substrate. However, at higher microwave and millimeter wave frequencies a dielectric film overlying a signal trace can seriously degrade signal propagation. The application of a solder mask over planar waveguides (having electrical lengths comparable to the radiation wavelength) causes a frequency-dependent dispersion in the propagating mode. Extremely thin-film dielectric overlying films can be used to mitigate the propagation problems, however, these films are not robust during the solder reflow process.

It would be advantageous if a low-cost commercial fabrication process could be developed for forming microwave and millimeter wave frequency interfaces to and from a substrate.

It would be advantageous if a process could be developed that would permit low-dispersion propagation at millimeter wave frequencies over signal traces that connect to a solder connection formed between a substrate and either a flip-chip die or a PCB.

It would be advantageous if conventional, well-known, selective deposition solder mask techniques could be adapted for use in forming microwave and millimeter wave frequency interfaces.

SUMMARY OF THE INVENTION

Accordingly, a microwave to millimeter wave frequency signal interface is provided. The signal interface comprises an alumina substrate top surface with bonding pads, and finite-extent solder dams surrounding the bonding pads. The solder dam is a thick-film dielectric that is selectively formed through a photo-imaging process. The solder dam is a either a fired glass ceramic or co-fired ceramic material having a firing temperature of greater than 800 degrees C.

Typically, the solder dam has a substantially circular-shaped interior diameter. The bonding surface area, inside the interior diameter is then defined by the solder dam. The solder dam has a wall width that minimally overlies any signal trace connected to the bonding pad. Thus, signal propagation along the trace is not degraded.

In some aspects of the invention, coplanar waveguide signal traces, with associated ground traces, are formed on the substrate, and connected to signal and associated ground bonding pads. The signal and associated ground bonding pads are separated by a center-to-center distance in the range between 0.003 to 0.05 inches. Finite-extent solder dams are formed around each ground and signal bonding pad.

Once the solder dams are formed, a solder joint can be formed having a solder joint dimension defined by the solder dam. The solder joint connects the substrate bonding pads to bonding pads of an overlying flip-chip integrated circuit die. In some aspects of the invention, the flip-chip IC die is a semiconductor device and the solder joints are formed by reflowing solder balls attached to the IC die bonding pads.

A method for forming a microwave to millimeter wave frequency interface is also provided. The method comprises: forming a substrate having a top surface with a bonding pad; forming a finite-extent solder dam surrounding the substrate top surface bonding pad; and, forming a solder joint from the substrate top surface bonding pad and an interfacing flip-chip IC die. Details of the interface formation process are included below.

DETAILED DESCRIPTION OF THE PREFERRED EMBODIMENT

Figure 1A:
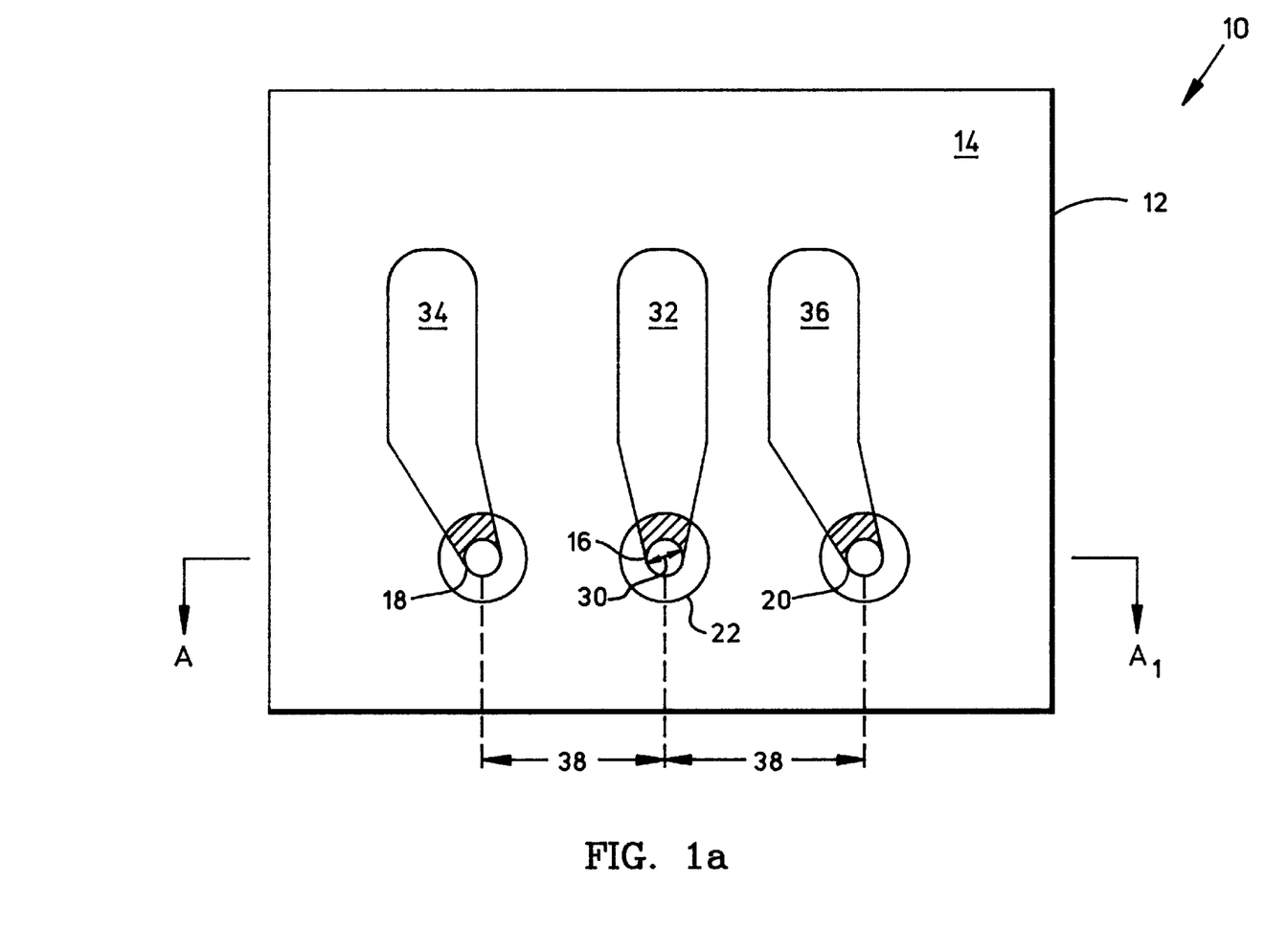
FIGS. 1a and 1b are plane (top) views of the microwave to millimeter wave frequency signal interface of the present invention.
Figure 1B:
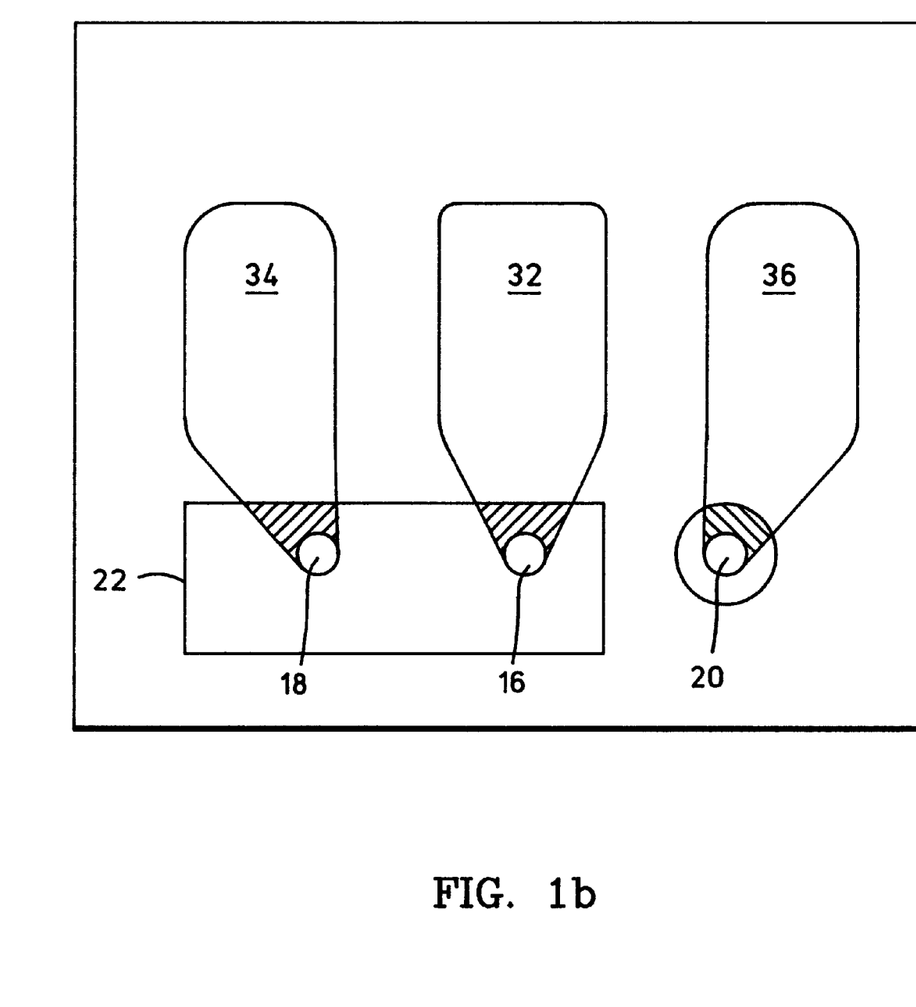

FIGS. 1a and 1b are plane (top) views of the microwave to millimeter wave frequency signal interface of the present invention. Referring to FIG. 1a, the signal interface 10 comprises a substrate 12 with a top surface 14. The substrate top surface 14 includes at least one bonding pad 16. Typically, the substrate top surface 14 includes a plurality of bonding pads. Bonding pads 18 and 20 are also shown. The interface invention is not limited to any particular number of bonding pads. A finite-extent, solder dam 22 overlies the substrate top surface 14 and surrounds the bonding pad 16. Solder dams 24 and 26 surround bonding pads 18 and 20, respectively. FIG. 1b illustrates a different form of the finite-extent solder dams.

Figure 2A:
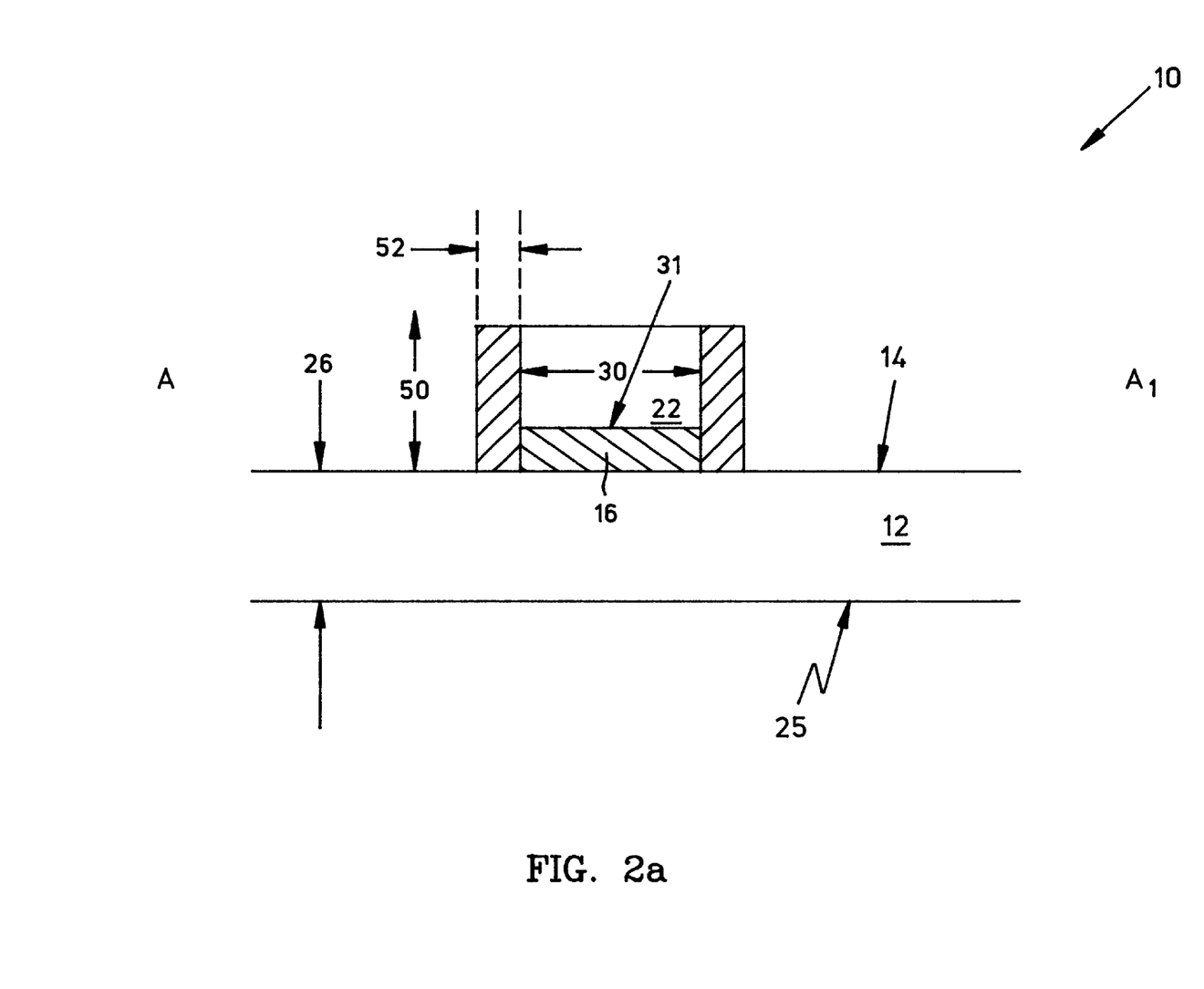
FIGS. 2a and 2b are partial cross-sectional views of the interface of FIG. 1a, featuring the bonding pad and the solder dam.
Figure 2B:
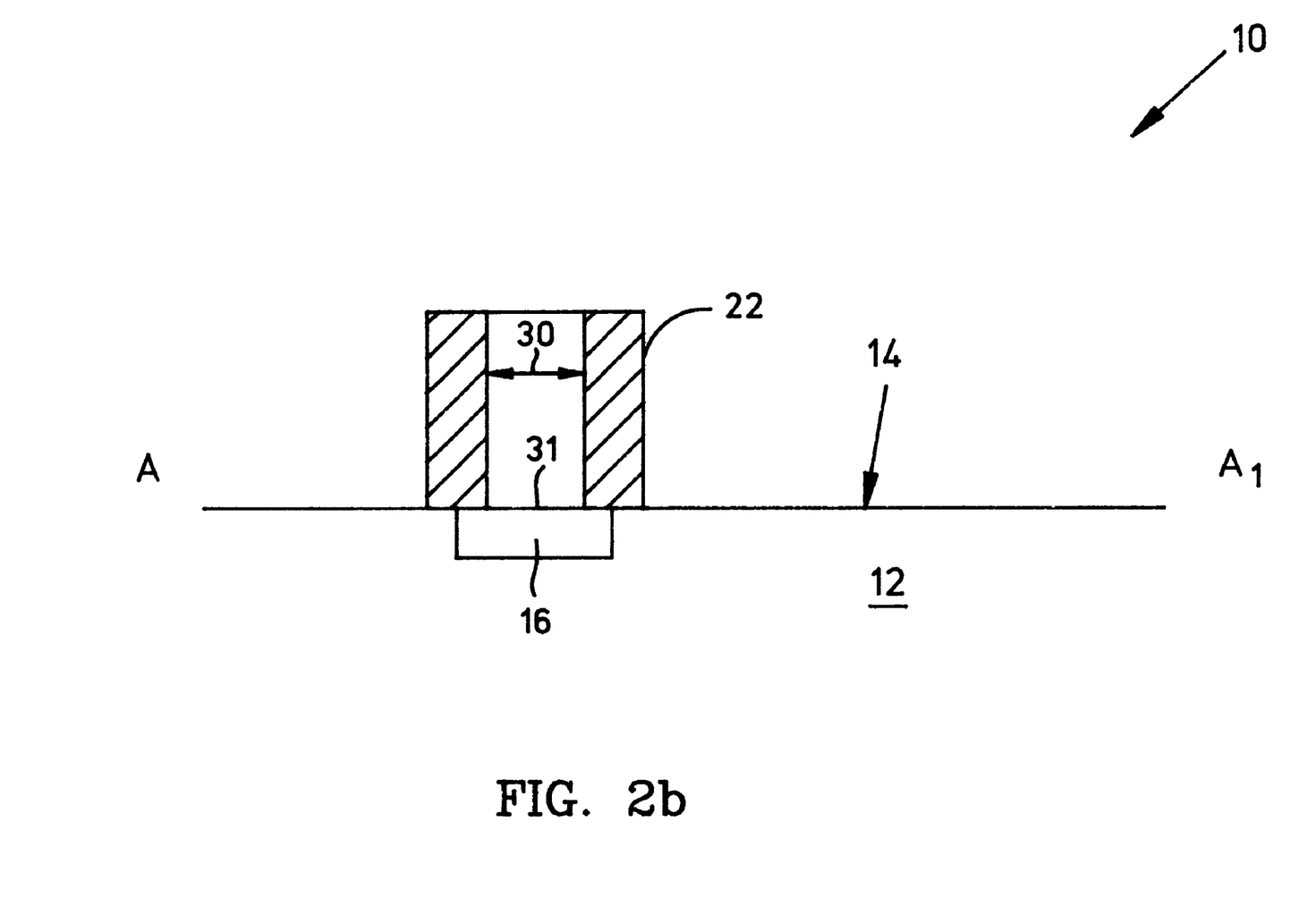

FIGS. 2a and 2b are partial cross-sectional views of the interface 10 of FIG. 1a, featuring the bonding pad 16 and the solder dam 22. As shown in FIG. 2a, it is typical for the substrate 12 to include a bottom surface 25 and a thickness 26 between the top 14 and bottom 25 surfaces in the range of 0.005 to 0.025 inches. Since the invention is primarily concerned with microwave to millimeter wave frequencies, the substrate 12 has a dielectric constant in the range of 2 and 11. The substrate is alumina ceramic material or glass-ceramic, in some aspects of the invention. However, the invention is not limited to any particular substrate material or dielectric constant. Other materials are available from manufactures such as 3M and Rogers. Other possible materials that might be used as a substrate material are plastic resin, Teflon, or polyimides.

The cross-hatched areas show where the bonding pad 16 and solder dam 22 have been sectioned in the drawing. Although the bonding pad 16 is depicted as sitting on top of surface 14, in other aspects of the invention, the top surface 31 of the bonding pad 16 is flush, or even below the substrate top surface 14. Therefore, where it is stated that a bonding pad or trace (introduced below) overlies the substrate top surface 14, it is understood that the bonding pad or trace may literally overlie the top surface 14, be imbedded, or be partially imbedded in the top surface 14. FIG. 2b depicts the bonding pad 16 being substantially flush with the substrate top surface 14.

Typically, the solder dam 22 is formed from a thick-film dielectric film. In particular, the solder dam 22 is a dielectric material selected from the group including fired glass ceramics and co-fired ceramic materials having a firing temperature of greater than 800 degrees C. The firing process typically takes at least fifteen minutes. Alternately, if materials such as plastic resin, Teflon, and polyimides are used, a curing temperature of 300 degrees C would be more practical. As is well understood, there is a relationship between the firing temperatures and the firing time, and the present invention is not limited to any particular firing process. As explained in more detail below, thick-film materials are designed to be processed at high temperatures and are used in high-temperature commercial solder masking processes.

Not all selective mask processes are practical in forming the solder dam 22, due to the precise geometries and alignments required. Screen printing and contact mask techniques are also available, but have conventionally offered less resolution. The solder dam is typically a dielectric film that is selectively formed through the conventional photo-imaging process. In one aspect of the invention, the dielectric film is light-sensitive material such as Fodel (DuPont). A photo-imaging process forms a solder dam pattern in the light-sensitive dielectric, and patterned areas are selectively removed. Alternately, a photo-resist film is deposited over the dielectric film. A photo-imaging process forms a solder dam pattern in the photo-resist. Then, selective areas of the photo-resist, and underlying dielectric film, are removed to yield the solder dam.

Returning to FIG. 1a, the solder dam is depicted as having a substantially circular-shaped interior diameter 30. Once again the circular shape is dictated by practical considerations of minimally overlapping the underlying signal traces and the circular shape of the solder balls, to be discussed below. That is, solder dams of other internal shapes could also enable the present invention. The bonding pad 16 has a top surface bonding area 31 defined by the solder dam circular-shaped interior diameter 30. Note that solder dam 22 has a exterior perimeter that is also substantially circular shaped. FIG. 1b depicts some alternate solder dam exterior perimeter shapes. As shown, solder dam 22 has a substantially rectangular shape. Two interior diameters are formed in solder dam 22 to expose bonding pads 16 and 18. Many other solder dam shapes are also possible. Furthermore, the finite-extent solder dam 22 can surround any number of bonding pads. The number of exposed bonding pads is not limited to one, as shown in FIG. 1a, or two, as shown in FIG. 1b.

As shown in FIG. 2a, in some aspects of the invention, the top surface bonding area 31 is substantially equal to the entire bonding pad. However, as shown in FIG. 2b, in other aspects the top surface bonding area 31 is only a portion of the total pad top surface. Thus, not only is solder dam 22 internal diameter 30 critical is defining the pad bonding area 31, it is also critical in defining the cross-sectional dimension of the solder interface to the pad and, thus, is a key factor in characterizing the impedance of the solder joint interface. These issues are discussed in detail below.

Typically, the substrate top surface 14 further includes a signal trace 32 connected to the bonding pad 16. Traces 34 and 36 are also shown connected, respectively, to bonding pads 18 and 20. The solder dam 22 overlies the signal trace 32 as shown by the cross-hatched area between the bonding pad 16 and the uncovered areas of the signal trace 32.

In some aspects of the invention, especially at high frequencies, the interface includes ground structures associated with the signal structures. Then, the substrate top surface signal trace 32 is a coplanar waveguide signal trace with associated ground traces 34 and 36. The bonding pad 16 is a signal bonding pad and bonding pads 18 and 20 are associated ground bonding pads, respectively corresponding to the coplanar waveguide signal trace 32, and ground traces 34 and 36. The substrate top surface bonding pads have a center, and the center-to-center distance 38 between bonding pads is in the range between 0.003 to 0.05 inches.

Figure 3:
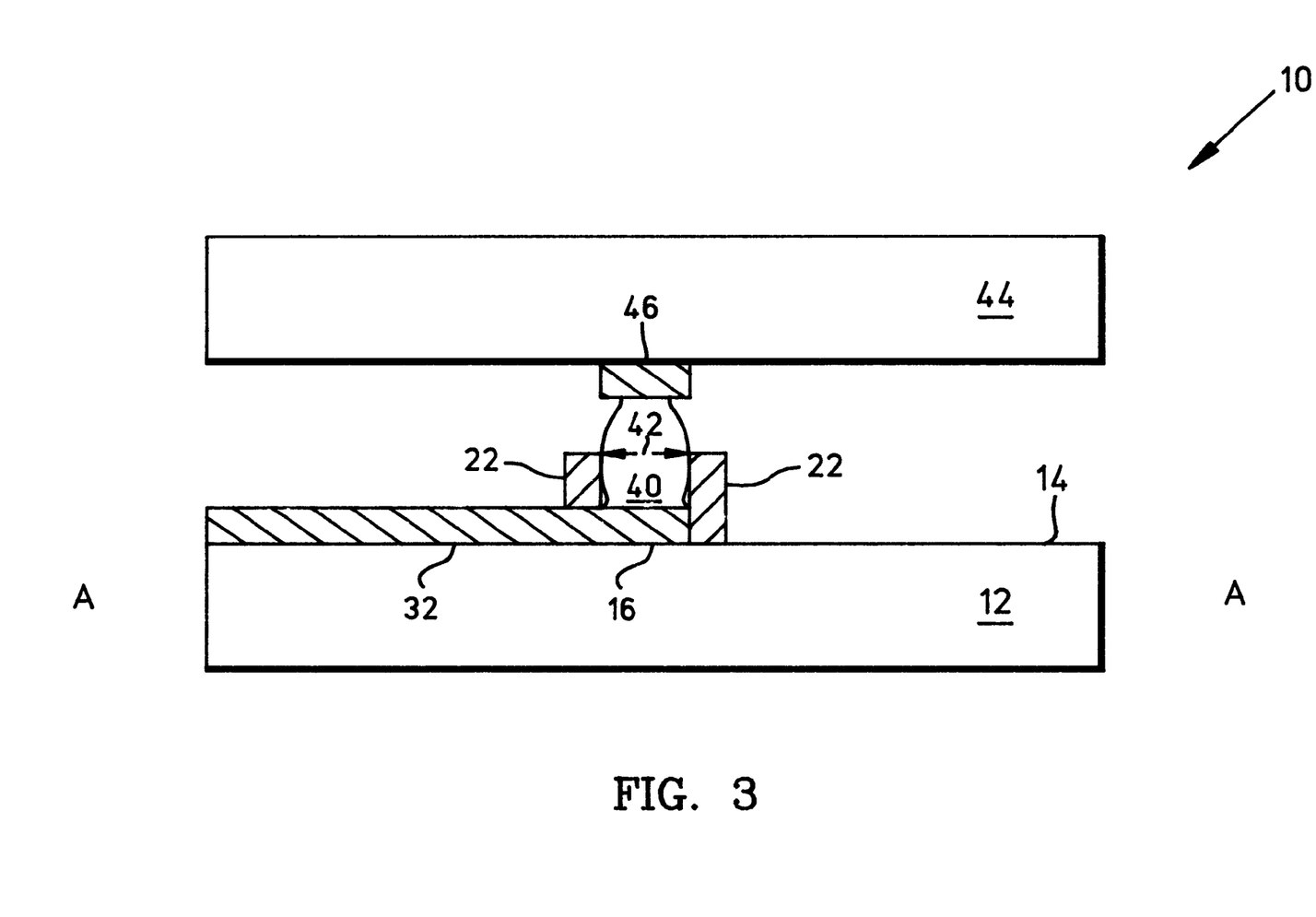
FIG. 3 is a partial cross-section view of the inventive interface of FIG. 2a with additional features.

FIG. 3 is a partial cross-section view of the inventive interface of FIG. 2a with additional features. A solder joint 40 is shown overlying the substrate top surface bonding pad 16. As can be seen, the solder dam helps control the shape of the solder joint and defines the solder joint dimension 42. Note however, that the solder joint 40 does not necessarily have a uniform height or width, so that the joint dimension 42 may vary depending on where the cross-section is taken. In general, it is assumed that the joint dimension 42 is the maximum cross-section or width of the joint 40. It should also be noted that the solder dam 22 is critical is shaping the joint dimension 42.

The solder dam 22 prevents the solder from running down the signal trace 32, or across the substrate top surface 14 shorting traces 32, 34, and 36 (see FIG. 1). A flip-chip IC die 44 is shown having a bonding pad 46 overlying, and connected to, the solder joint 40. In some aspects of the invention, the solder joint 40 is a reflown solder ball that was originally attached to flip-chip IC die 44. In some aspects of the invention, the flip-chip IC die 44 is a semiconductor device, and the solder ball 40 is a PbSn or AuSn solder ball. Although the invention's interface has been described as being fabricated only from the top surface 14, the interface concept is equally applicable to fabricating interfaces from the bottom surface 25 (see FIG. 2a). Likewise, the concept is equally applicable to interfaces with overlying, as well as underlying flip-chip IC dice. Further, the flip-chip IC dice need not be semiconductor devices.

Returning briefly to FIG. 2a, the solder dam 22 has a layer thickness 50 in the range of 0.0005 and 0.008 inches, and a wall width 52 in the range of 0.003 and 0.06 inches. However, it should be understood that the invention is not limited to any particular dimension or correspondence between the layer and wall width dimensions. In general, the solder dam is made from a dielectric having a dielectric constant that is similar to, or less than that of the host substrate. More specifically, the dielectric typically has a dielectric constant in the range of 2 to 9.5.

Returning to FIG. 3, the size of the bonding pad 16 is comparable to the solder ball diameter. In fact, the solder joint 40 is shown as substantially a spherical ball. The size of the bonding pad top surface 31 can be either larger or smaller with respect to the solder joint dimension 42, to create a smaller or larger aspect ratio of the solder joint.

Figure 4:
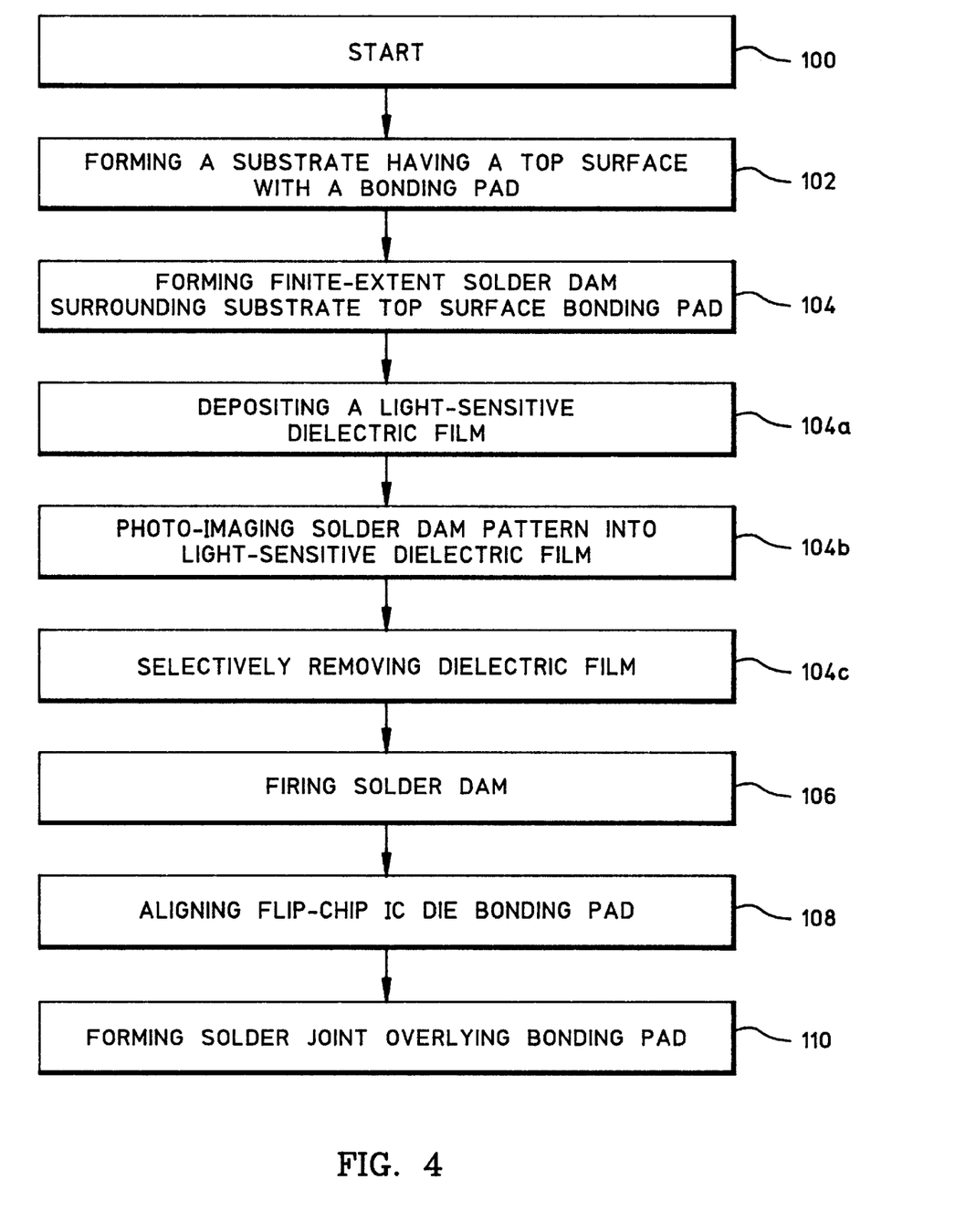
FIG. 4 is a flowchart illustrating the present invention method for forming a microwave frequency interface.

FIG. 4 is a flowchart illustrating the present invention method for forming a microwave to millimeter wave frequency interface. Although the method is depicted as a sequence of numbered steps for clarity, no order should be inferred from the numbering unless explicitly stated. The method starts at Step 100. Step 102 forms a substrate having a top surface with a bonding pad. Step 104 forms a finite-extent solder dam surrounding the substrate top surface bonding pad.

In some aspects of the invention, forming the solder dam in Step 104 includes depositing a dielectric film, and selectively removes the dielectric film to form the solder dam. More specifically, Step 104a isotropically deposits a light-sensitive dielectric film overlying the substrate top surface. Step 104b photo-images a solder dam pattern into the light sensitive dielectric film. Step 104c selectively removes the dielectric film, leaving the solder dam. A further step, Step 106 fires the solder dam. In an alternate process (not shown), Step 104a isotropically deposits a dielectric film overlying the substrate top surface. Step 104b isotropically deposits a photo-resist film over the dielectric film. Step 104c photo-images a solder dam pattern in the photo-resist. Step 104d selectively removes the photo-resist and underlying areas of dielectric film, leaving the solder dam. Then, the remainder of the photo-resist is removed. Step 106 fires the solder dam.

Regardless of the solder dam formation process, firing the solder dam in Step 106 includes heating the first solder dam to a temperature of greater than 800 degrees C for at least fifteen minutes. As mentioned earlier, the 800 degree C firing temperature is used for glass ceramic and co-fired ceramic materials. Alternately, when plastic resin, Teflon, and polyimides are used, a 300 degree C curing temperature is more practical.

In some aspects of the invention, depositing a dielectric film in Step 104 includes depositing a dielectric film selected from the group of materials including alumina ceramic, glass-ceramic, plastic resin, Teflon, and polyimides. Typically, the dielectric film is deposited to a layer thickness in the range of 0.0005 to 0.008 inches In some aspects of the invention, forming a solder dam in Step 104 includes forming a first solder dam with a wall width in the range of 0.003 to 0.06 inches.

A further step, Step 108, aligns a flip-chip IC die bonding pad above the substrate top surface bonding pad. Step 110 forms a solder joint overlying the bonding pad, inside the solder dam. In some aspects, forming a solder joint overlying the bonding pad, inside the solder dam in Step 110 includes forming a solder joint between the flip-chip IC die bonding pad and the substrate top surface bonding pad.

In some aspects of the invention, forming a finite-extent solder dam surrounding the substrate top surface bonding pad in Step 104 includes selectively forming a solder dam having substantially circular-shaped interior diameter. Then, forming a solder joint overlying the bonding pad, inside the first solder dam in Step 110 includes forming a solder joint having a joint dimension defined by the solder dam circular-shaped interior diameter.

In some aspects of the invention, aligning a flip-chip IC die bonding pad above the substrate top surface bonding pad in Step 108 includes overlying a semiconductor device bonding pad, having a solder ball attached to the semiconductor device bonding pad, over the substrate top surface bonding pad. Then, forming a solder joint between the semiconductor device bonding pad and the substrate top surface bonding pad in Step 110 includes heating the substrate to reflow the solder ball.

In some aspects of the invention, forming a substrate having a top surface with a bonding pad in Step 102 includes forming a substrate selected from the group including alumina ceramic and glass-ceramic materials having a thickness in the range from 0.005 to 0.025 inches and a dielectric constant in the range from 2 to 11. More particularly, the dielectric constant is in the range of 5 to 11 for ceramic and glass materials, and in the range of 2 to 6 for plastic resin, Teflon, and polyimides. In some aspects, forming a substrate having a top surface with a bonding pad in Step 102 includes forming a signal trace overlying the substrate top surface connected to the bonding pad. Then, forming a finite-extent solder dam surrounding the substrate top surface bonding pad in Step 104 includes forming the solder dam to partially overlie the signal trace.

In some aspects of the invention, forming a substrate having a top surface with a bonding pad in Step 102 includes forming bonding pads connected to coplanar waveguide signal traces and associated ground traces. Then, forming a finite-extent solder dam surrounding the substrate top surface bonding pad in Step 104 includes forming the solder dam to overlie the coplanar signal and ground traces in the vicinity of their corresponding bonding pads.

In some aspects of the invention, forming a substrate having a top surface with a bonding pad in Step 102 includes forming bonding pads connected to the coplanar waveguide signal and ground traces, where the center-to-center distance between bonding pads is in the range between 0.003 to 0.05 inches An example is presented below as to how the present invention concepts are used to interface a substrate to an IC flip-chip die and to a PCB. In this example, the substrate is ceramic, typically 0.015 inch thick from top to bottom, with a dielectric constant in the range of 8 to 11 times the dielectric constant of air. Selectively positioned holes clear through the ceramic substrate from the top surface to the bottom surface. Selectively patterned metal layers are formed on the top and bottom surfaces of the ceramic substrate.

Vias, which are structures that substantially fill the holes in the ceramic substrate with a metal, make electrical connection between the top and bottom metal patterns. The substrate top surface metal patterns have at least one coplanar waveguide (CPW) transmission line for the routing of broad bandwidth signals from the flip chip IC die. Additionally, the bottom surface metal patterns have at least one CPW transmission line for routing of broad bandwidth signals from at least one BGA ball site. An internal substrate transition is formed in the region of the vias that connect a bottom side CPW structure and a top side CPW structure. A planar waveguide transition region, as part of the top surface metal patterns, transforms a wide CPW to a narrow CPW. This planar transition might include both tapers and bends in the CPW transmission line. This transition maintains the broad bandwidth impedance match and interfaces a CPW that is compatible with BGA ball pitches and a CPW that is compatible with flip chip die solder ball pitches and assembly tolerances.

A permanent dielectric film is deposited over the top surface of the ceramic substrate and top surface metal patterns and patterned to form solder dams, as described above. The process typically forms a plurality of solder dams across the top surface. This plurality of solder dams will be referred to herein as a finite-extent solder mask. Each solder dam acts to prevent wetting of molten solder to any metal patterns that are covered by the solder dam, and stops solder flow past the solder dam to protect uncovered metal patterns that abut the solder dam on the opposite side of the solder flow.

A permanent, finite-extent dielectric solder mask is also formed over the bottom surface of the ceramic substrate and bottom surface metal patterns. The finite-extent solder mask acts to prevent wetting of molten solder to any metal patterns that are covered by the mask, and stops solder flow past the solder mask to protect uncovered metal patterns that abut the mask on the opposite side of the solder flow.

The assembly proceeds with aligning and placing the flip chip IC die onto the top surface of the substrate. The electrical connection is then formed through a standard high-temperature solder reflow process. The reflown balls 1) act as a standoff pillar to maintain the separation between the die and the ceramic substrate, and 2) form a controlled impedance electrical connection between the die and the substrate.

The diameter of the die solder balls and spacing between solder balls are specific to the die. Typical solder ball diameters are in the range of 0.001 inch to 0.010 inch, prior to reflow, with pitches (center to center distance) of 0.003 inch to 0.050 inch between solder balls. A die solder ball pitch of 0.010 inch is typical for ball diameters of 0.004 inch.

The substrate top surface dielectric solder mask forms a barrier to solder flow in the region of the flip chip IC die attach, but such a mask does not substantially cover the top surface CPW structure. The solder mask only covers the substrate CPW in the area of overlap between the die and the substrate.

Spherical balls are also attached to metal patterns on the bottom surface of the ceramic substrate, arranged in a BGA to allow connection of the bottom surface metal patterns to a PCB or multiple chip module (MCM). Balls are composed of a metal or alloy and are attached by brazing or soldering of the ball to the bottom metal patterns or by melting the ball itself if the ball is a solder material.

The diameter of the BGA balls and spacing between balls were selected to maintain broad bandwidth impedance match between the substrate bottom surface CPW and similar CPW transmission line structures on the PCB or MCM. The optimal ball diameter is scaleable to other dimensions in the design. For a 1.0-millimeter ball pitch (center to center distance) and a CPW center conductor width of 0.016 inch, the optimal ball diameter is between 0.012 inch and 0.016 inch.

The assembled substrate with flip chip IC die and BGA balls is soldered onto the PCB with a solder material that includes a eutectic SnPb bearing solder compound with activation and melting temperature lower than the melting temperature of the BGA balls. The balls 1) act as a standoff pillar to maintain the separation between the ceramic substrate and the PCB, and 2) form a controlled impedance electrical connection between the substrate and the PCB.

The above-described substrate design and assembly processes circumvent the problem associated with frequency-dependent dispersion in propagation of microwave to millimeter wave frequency signals across substrate interfaces. By selectively patterning fired-glass or co-fired ceramic solder masks that only cover a small length of the waveguide in proximity to the solder ball signal interface attach sites, the advantages of a solder mask are realized without substantially degrading signal integrity. The solder masks act as both a solder dam and as a means to define the bonding surface area. Thus, microwave to millimeter wave frequency solder mask-defined solder joints are described on the substrate surface. Examples have been given to briefly illustrate the concepts of the present invention. However, the microwave to millimeter wave frequency solder dam signal interface can be enabled through alternate fabrication processes. Other variations and embodiments of the invention will occur to those skilled in the art.

We claim:

1. A microwave to millimeter wave frequency signal interface comprising:
   a substrate top surface including a bonding pad;
   a solder dam overlying the substrate top surface and surrounding the bonding pad; and
   a solder material dispersed within an area defined by the solder dam, the solder material for forming, at a frequency within a microwave to millimeter wave frequency range, an impedance matched solder joint interface between the bonding pad and an integrated circuit bonding pad of an integrated circuit.

2. The signal interface of claim 1 wherein the solder dam is a thick-film dielectric.

3. The signal interface of claim 2 wherein the solder dam is selectively formed through a photo-imaging process.

4. The signal interface of claim 2 wherein the solder dam is a dielectric material selected from the group consisting of fired glass ceramic and co-fired ceramic materials having a firing temperature of greater than 800 degrees C.

5. The signal interface of claim 2 wherein the solder dam is a dielectric having a dielectric constant in the range between 2 and 9.5.

6. The signal interface of claim 2 wherein the solder dam is a dielectric material selected from the group consisting of plastic resins, polytetrafluoroethylene, and polyimides having a curing temperature of greater than 300 degrees C.

7. The signal interface of claim 1 wherein the solder dam has an exterior perimeter and a substantially circular-shaped internal diameter; and
   wherein the substrate top surface includes a bonding pad having a top surface bonding area defined by the solder dam circular-shaped internal diameter.

8. The signal interface of claim 1 wherein the substrate top surface further includes a signal trace connected to the bonding pad; and
   wherein the solder dam partially overlies the signal trace.

9. The signal interface of claim 8 wherein the substrate top surface signal trace is a coplanar waveguide signal trace with associated ground traces, and wherein the substrate top surface includes signal and associated ground bonding pads, respectively corresponding to the coplanar waveguide signal and ground traces; and
   the substrate further comprising:
      solder dams partially overlying the substrate top surface signal and associated ground bonding pads; and
      wherein each substrate top surface bonding pad has a center, and the center-to-center distance between bonding pads is in the range between 0.003 to 0.05 inches.

10. The signal interface of claim 1 wherein the substrate includes a bottom surface and a thickness between the top and bottom surfaces in the range of 0.005 to 0.025 inches.

11. The signal interface of claim 6 wherein the substrate has a dielectric constant in the range of 2 and 11.

12. The signal interface of claim 11 wherein the substrate is selected from the group of materials consisting of alumina ceramic, glass-ceramic, plastic resin, polytetrafluoroethylene, and polyimides.

13. The signal interface of claim 1 wherein the solder joint is a reflown solder ball.

14. The signal interface of claim 1 wherein the solder dam has a layer thickness in the range of 0.0005 and 0.008 inches.

15. The signal interface of claim 1 wherein the solder dam has a wall width in the range of 0.003 and 0.060 inches.

16. A method for forming a microwave to millimeter wave frequency interface, the method comprising:
   forming a substrate having a top surface with a bonding pad; and
   forming a solder dam surrounding the substrate top surface bonding pad; and
   heating a solder material within an area defined by the solder dam to form, at a frequency within a microwave to millimeter wave frequency range, an impedance matched solder joint interface between the bonding pad and an integrated circuit bonding pad of an integrated circuit.

17. The method of claim 16 wherein forming the solder dam includes:
   depositing a dielectric film; and
   selectively removing the dielectric film to form the solder dam.

18. The method of claim 17 wherein forming the solder dam includes:
   isotropically depositing a light-sensitive dielectric film overlying the substrate top surface;
   photo-imaging a solder dam pattern into the light-sensitive dielectric film;
   selectively removing the light-sensitive dielectric film, leaving the solder dam; and
   firing the solder dam.

19. The method of claim 18 wherein depositing a dielectric film includes depositing a dielectric film selected from the group of materials consisting of alumina ceramic and glass-ceramic;
   wherein firing the solder dam includes heating the first solder dam to a temperature of greater than 800 degrees C for at least 15 minutes.

20. The method of claim 18 wherein depositing a dielectric film includes depositing a dielectric film selected from the group of materials consisting of plastic resin, polytetrafluoroethylene, and polyimides; and
   wherein firing the solder dam includes curing the first solder dam to a temperature of greater than 300 degrees C for at least 15 minutes.

21. The method of claim 17 wherein forming a solder dam includes:
   isotropically depositing a dielectric film overlying the substrate top surface;
   isotropically depositing a photo-resist film over the dielectric film;
   photo-imaging a solder dam pattern into the photo-resist film;
   selectively removing the photo-resist film and underlying areas of the dielectric film, leaving the solder dam; and
   firing the solder dam.

22. The method of claim 21 wherein depositing a dielectric film includes depositing a dielectric film selected from the group of materials consisting of alumina ceramic and glass-ceramic;
   wherein firing the solder dam includes heating the solder dam to a temperature of greater than 800 degrees C for at least 15 minutes.

23. The method of claim 21 wherein depositing a dielectric film includes depositing a dielectric film selected from the group of materials consisting of plastic resin, polytetrafluoroethylene, and polyimides; and
   wherein firing the solder dam includes curing the solder dam to a temperature of greater than 300 degrees C for at least 15 minutes.

24. The method of claim 17 wherein depositing a dielectric film includes depositing a dielectric film having a layer thickness in the range of 0.0005 and 0.008 inches.

25. The method of claim 16 wherein forming a solder dam includes forming a solder dam with a wall width in the range of 0.003 to 0.060 inches.

26. The method of claim 16 further comprising:
aligning the integrated circuit bonding pad above the substrate top surface bonding pad prior to heating the solder material to form the impedance matched solder joint.

27. The method of claim 26 wherein forming the solder dam surrounding the substrate top surface bonding pad includes selectively forming a solder dam having a substantially circular-shaped internal diameter; and
wherein heating to form the impedance matched solder joint includes forming the solder joint having a joint dimension defined by the solder dam circular-shaped interior diameter.

28. The method of claim 26 in which the integrated circuit is a semiconductor device;
wherein aligning the integrated circuit bonding pad above the substrate top surface bonding pad includes aligning a semiconductor device bonding pad, having a solder ball attached to the semiconductor device bonding pad, over the substrate top surface bonding pad.

29. The method of claim 16 wherein forming a substrate having a top surface with a bonding pad includes forming a substrate selected from the group of alumina ceramic and glass-ceramic materials having a thickness in the range from 0.005 to 0.025 inches and a dielectric constant in the range from 2 to 11.

30. The method of claim 16 wherein forming a substrate having a top surface with a bonding pad includes forming a signal trace overlying the substrate top surface connected to the bonding pad; and
wherein forming the solder dam surrounding the substrate top surface bonding pad includes forming the solder dam to partially overlie the signal trace.

31. The method of claim 30 wherein forming a substrate having a top surface with a bonding pad includes forming bond pads connected to coplanar waveguide signal traces and associated ground traces; and
wherein forming the solder dam surrounding the substrate top surface bonding pad includes forming the solder dam to overlie the coplanar signal and ground traces in the vicinity of their corresponding bonding pads.

32. The method of claim 31 wherein forming a substrate having a top surface with a bonding pad includes forming bonding pads connected to the coplanar waveguide signal and ground traces, where the center-to-center distance between bonding pads is in the range between 0.003 to 0.05 inches.

* * * * *